United States Patent
Honda et al.

(10) Patent No.: US 6,885,076 B2
(45) Date of Patent: Apr. 26, 2005

(54) SEMICONDUCTOR LASER DEVICE

(75) Inventors: Shoji Honda, Tottori (JP); Yasuhiro Watanabe, Tottori (JP); Yasuyuki Bessho, Tottori (JP); Kentarou Tanaka, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 12 days.

(21) Appl. No.: 10/333,072
(22) PCT Filed: Jun. 21, 2001
(86) PCT No.: PCT/JP01/05340
 § 371 (c)(1),
 (2), (4) Date: Jan. 16, 2003
(87) PCT Pub. No.: WO02/07275
 PCT Pub. Date: Jan. 24, 2002

(65) Prior Publication Data
 US 2003/0178711 A1 Sep. 25, 2003

(30) Foreign Application Priority Data

| Jul. 17, 2000 | (JP) | 2000-216162 |
|---|---|---|
| Jul. 19, 2000 | (JP) | 2000-219167 |
| Jul. 26, 2000 | (JP) | 2000-225602 |
| Jul. 26, 2000 | (JP) | 2000-225603 |
| Jul. 28, 2000 | (JP) | 2000-229298 |

(51) Int. Cl.$^7$ .......................................... H01L 31/0203
(52) U.S. Cl. ........................................ 257/433; 257/775
(58) Field of Search .......................... 257/666, 676, 257/766, 707, 431, 432, 433, 773, 775, 787, 706

(56) References Cited

U.S. PATENT DOCUMENTS 6,020,632 A * 2/2000 Barone et al.

FOREIGN PATENT DOCUMENTS

| JP | 63-168931 A1 | 11/1988 |
| JP | 02-054263 A1 | 4/1990 |
| JP | 06-045703 A1 | 2/1994 |
| JP | 06-053603 A1 | 2/1994 |
| JP | 07-326814 A1 | 12/1995 |
| JP | 07-0321407 A1 | 12/1995 |
| JP | 09-092931 A1 | 1/1997 |
| JP | 10-154848 A1 | 6/1998 |
| JP | 10-209551 A1 | 8/1998 |
| JP | 11-307871 A1 | 11/1999 |
| JP | 2000-164966 A1 | 6/2000 |

OTHER PUBLICATIONS

A copy of International Preliminary Examination Report (Japanese) completed on Jun. 25, 2002.

A copy of International Search Report mailed on Sep. 25, 2001.

* cited by examiner

Primary Examiner—S. V. Clark
(74) Attorney, Agent, or Firm—McDermott Will & Emery LLP

(57) ABSTRACT

A semiconductor laser device includes a semiconductor laser element, a lead having an element disposing section where elements are disposed and a resin bonded to the lead. The lead has a thick portion and a thin portion with the thick portion being formed to extend at least in the direction of the width of the resin to cover a region having a length equal to or greater then the width of the resin. A semiconductor laser device has a semiconductor laser element, a lead having an element mount portion on which the semiconductor laser element is mounted and a resin maintained in intimate contact with the lead. The lead has a thicker portion and a thinner portion. The thicker portion is formed to extend in the direction of the width of the resin over a width equal to or greater than the width of the resin.

25 Claims, 10 Drawing Sheets

SEMICONDUCTOR LASER DEVICE

TECHNICAL FIELD

The present invention relates to a semiconductor laser device.

BACKGROUND ART

Much attention is paid to semiconductor laser devices employing a package composed of a lead frame and a resin molding, because they are comparatively inexpensive and easy to mass-produce. However, such resin molding packages suffer from poor heat rejection in comparison with metal can packages that have conventionally been widely used. For this reason, resin molding packages are now used almost exclusively in infrared lasers having good temperature characteristics, and not in high-output lasers for CD-R/W drives, or in infrared lasers for DVD drives, or in blue or similar lasers requiring high operating voltages. An improvement on a resin molding package for better heat dissipation is proposed, for example, in Japanese Patent Application Laid-Open No. H11-307871. According to this proposal, the portion of a lead on which a laser element is mounted is made thicker, and the lead is enclosed in a resin with that portion exposed on the bottom face of the resin.

However, even when only the portion of the lead on which the laser element is mounted is made thicker as described above, a semiconductor laser device is seldom built into a pickup device in such a way that the thicker portion of the lead is kept in contact with some part of (the body of) the pickup device during actual use. Thus, the above-mentioned improvement does not contribute much to better heat rejection. Moreover, when the lead is completely enclosed in the resin, the positioning of the semiconductor laser device needs to be done with respect to the resin, which is unstable as a reference for positioning. Moreover, the thicker portion of the lead lies only in part of the width of the semiconductor laser device, and thus does not contribute much to increasing the mechanical strength of the semiconductor laser device. Moreover, since the thicker portion of the lead is exposed on the reverse face of the resin as described above, the resin on the reverse face needs to be made so thin as not to hinder the exposure of the thicker portion of the lead. This makes it difficult to increase the strength with which the lead is fixed. Moreover, to allow the lead to be exposed on the reverse face of the resin, the thicker portion of the lead needs to be elevated considerably relative to the other portion thereof, and in addition the thick portion has only a small area. This results in the semiconductor laser device having poor flatness, making its handling difficult and its setting unstable.

When such a semiconductor laser device is built into an optical pickup device or the like, the former is usually set in the latter by inserting the package of the former in that direction in which it emits laser light. During this insertion, the resin portion of the semiconductor laser device often interferes with, or is caught at, the rim of the opening formed in the body of the optical pickup device to allow the insertion.

A conventional example of this type of semiconductor laser device is disclosed, for example, in Japanese Patent Application Laid-Open No. H6-45703. This publication discloses a lead, a laser element mounted on the lead, and a resin frame for protecting the laser element. Here, part of the top edge of the lead and the two side edges thereof are used as reference portions for fitting.

However, in the semiconductor laser device described above, a resin leak occurs at that part of the top edge of the lead which is used as a reference portion for fitting, and, quite disadvantageously, this makes this reference portion for fitting inaccurate. The inventors of the present invention investigated the cause of such a resin leak, and have found out that, because the outer profile of the resin frame is located outside the top edge of the lead, the resin leaks into a punching sag formed in a lead frame when it is punched out.

Moreover, in the semiconductor laser device described above, the laser element is placed at the tip end of the lead to prevent laser light from being reflected on the surface of the lead. Disadvantageously, this increases the risk of the laser element coming into contact with a finger or tweezers when it is handled.

FIG. 14 shows the conventional semiconductor laser device described above in a state observed in its fabrication process. In FIG. 14, a first lead 100, a second lead 101, and a third lead 102 are each connected, at one end, to an outer frame 103. A tie bar 104 is connected to a midpoint of each of the first, second, and third lead 100, 101, and 102.

A light-receiving element 105 is mounted near the tip end of the first lead 100, a laser element 106 is mounted on the light-receiving element 105, and necessary wiring (not shown) is strung. A resin frame 107 is so formed as to surround the laser element 106 and keep the first, second, and third leads 100, 101, and 102 fixed at the other end. When the tie bar 104 is cut in portions indicated as "a," "b," "c," "d," and "e," a semiconductor laser device 108 is obtained.

However, as described above, in this semiconductor laser device 108, after the tie bar 111 is cut, traces 111 and 113 thereof remain at a location 110 opposite to a reference portion 109 and at a location 113 opposite to a reference portion 112, respectively. Thus, when the semiconductor laser device 108 is inserted in a bracket (not shown) and pressed at the locations 110 and 113 with jigs, the tie bar traces 111 and 114 degrade the accuracy of fitting. This is the first disadvantage.

To overcome this disadvantage, the inventors of the present invention have abolished the link of the tie bar at the locations "a" and "e." With this configuration, however, when the outer frame 103 is fed over a predetermined distance on a machine before the tie bar is cut, the vibration of the feeding or the like causes, for example, the tip portion of the first lead 100 to incline in a direction indicated as G1 or G2. As a result, in an energizing test, a test probe deviates from where it is supposed to touch. This is the second disadvantage.

Moreover, a window 115 is formed in the resin frame 107 in front of the laser element 106, making the laser element 106 more likely to come into contact with a finger or tweezers. This is the third disadvantage.

DISCLOSURE OF THE INVENTION

An object of the present invention is to provide a semiconductor device having improved heat dissipation and mechanical strength and having stable reference surfaces for positioning to ensure high fitting accuracy. Another object is to achieve better bottom surface flatness. Another object is to provide a structure that allows smooth fitting to an optical pickup or the like and that allows large reference surfaces to be secured even in a miniaturized package. Another object is to provide a lead frame package having a simple structure and easy to mass-produce. Another object is to provide a semiconductor laser device less prone to resin leakage or contact with a finger or the like. Another object is to provide a semiconductor laser device that can be fitted with high accuracy, of which the tip portion of a lead is less prone to incline, and of which the light-emitting element is less prone to contact with a finger or the like.

To achieve the above objects, according to the present invention, a semiconductor laser device is provided with a semiconductor laser element, a lead having an element mount portion on which the semiconductor laser element is mounted, and a resin kept in intimate contact with the lead. Here, the lead has a thicker portion and a thinner portion, and the thicker portion is so formed as to extend, in the direction of the width of the resin, over a width equal to or greater than the width of the resin.

Alternatively, to achieve the above objects, according to the present invention, a semiconductor laser device is provided with a semiconductor laser element, a lead having an element mount portion on which the semiconductor laser element is mounted and a lead portion, and a resin kept in intimate contact with the lead. Here, the lead has different thicknesses in the element mount portion and lead portion thereof with a step left on the reverse face thereof, and the resin covers part of the lead including the step so as to form a support surface on the reverse face of the resin. The support surface has an area larger than that of the element mount portion.

BEST MODE FOR CARRYING OUT THE INVENTION

Figure 1:
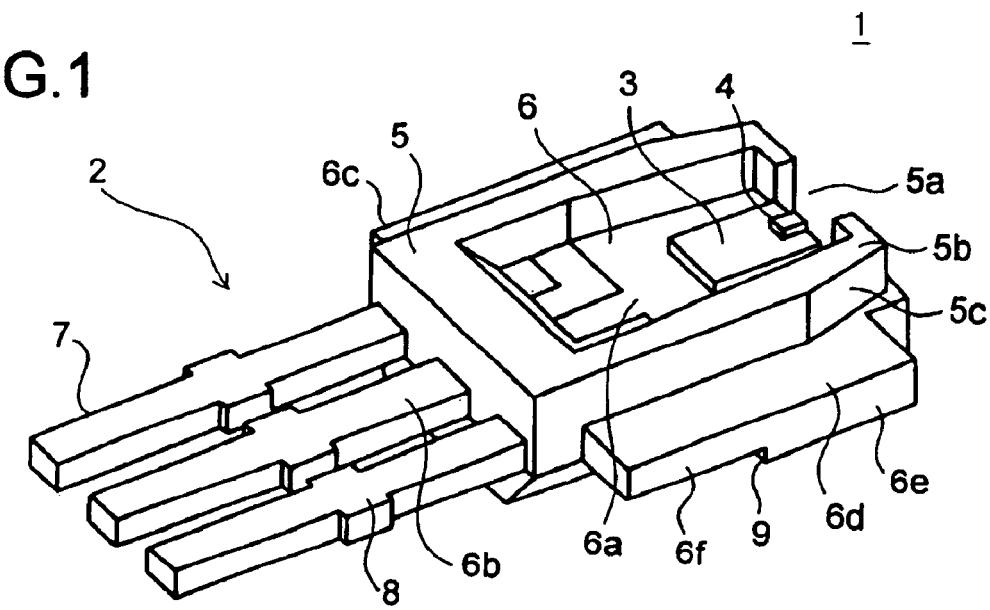
FIG. 1 is a perspective view of the semiconductor laser device of a first embodiment of the invention.
Figure 2:
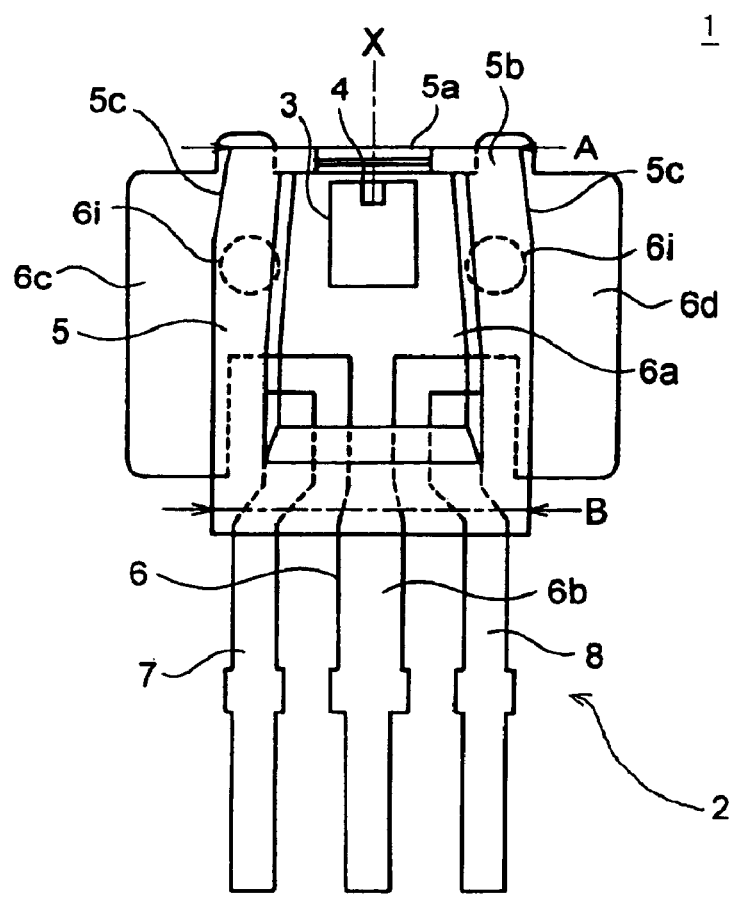
FIG. 2 is a front view of the semiconductor laser device of the first embodiment of the invention.
Figure 3:
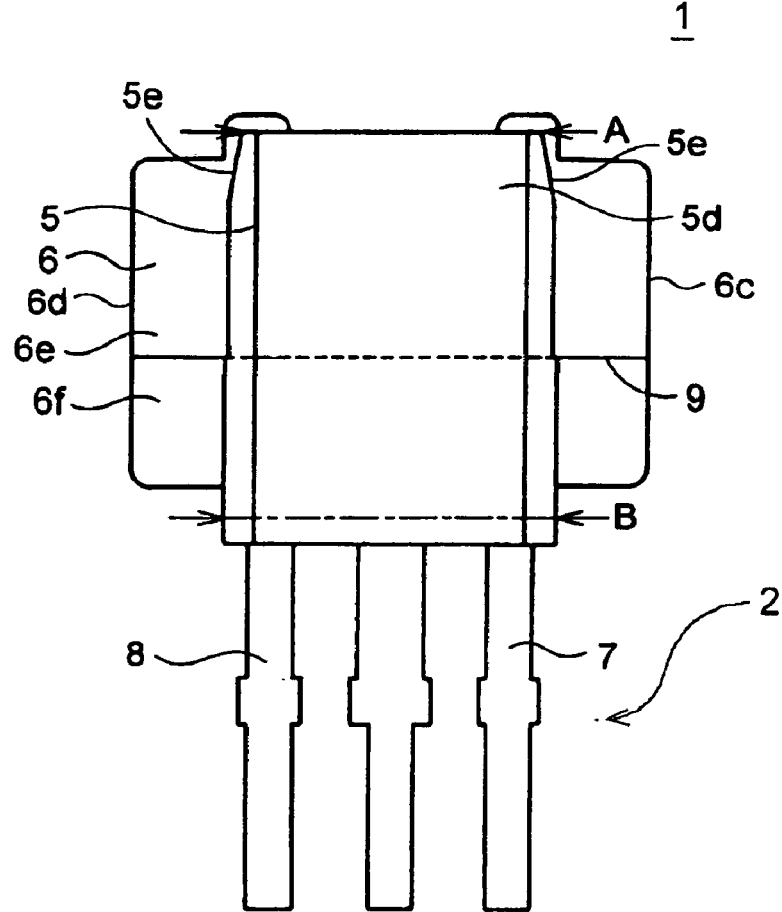
FIG. 3 is a rear view of the semiconductor laser device of the first embodiment of the invention.
Figure 4:
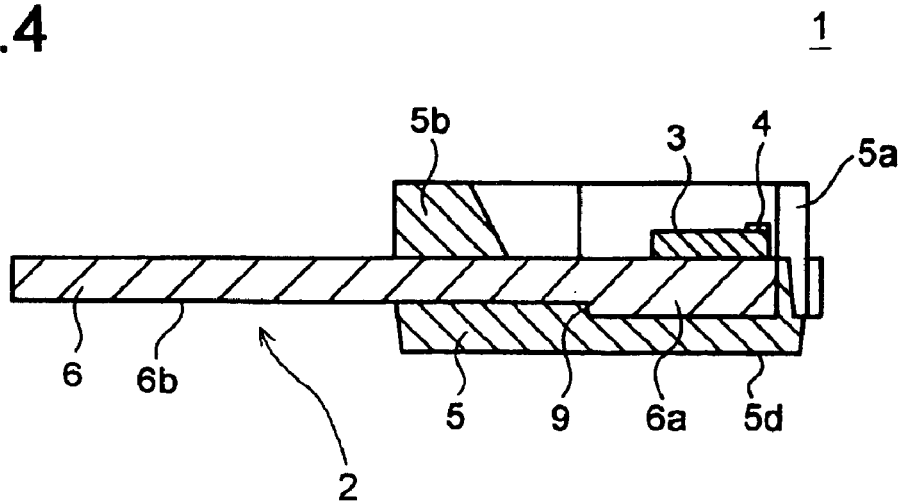
FIG. 4 is a sectional view of the semiconductor laser device of the first embodiment of the invention.

First, a first embodiment of the invention will be described with reference to the drawings. FIG. 1 is a perspective view of the semiconductor laser device of the first embodiment of the invention. FIG. 2 is a front view of the semiconductor laser device of the first embodiment of the invention. FIG. 3 is a rear view of the semiconductor laser device of the first embodiment of the invention. FIG. 4 is a sectional view of the semiconductor laser device of the first embodiment of the invention.

In the semiconductor laser device 1 of this embodiment, a submount 3 is disposed on and fixed to the top face of a lead frame 2, a semiconductor laser element 4 is disposed on and fixed to the top face of the submount 3, and the lead frame 2 is kept fixed by a resin 5 disposed in intimate contact therewith.

The lead frame 2 is made of a metal having high thermal and electrical conductivity, and is formed out of copper, iron, an alloy thereof, or the like into the shape of a plate. The lead frame 2 comprises a plurality of leads, specifically a main lead 6 on which the semiconductor laser element is mounted and subsidiary leads 7 and 8, separate from the main lead 6, for wiring. These individual leads are put together by the insulating resin 5 so as to form a lead frame package.

The main lead 6 consists of the following integrally formed portions: an element mount portion 6a, a lead portion 6b serving as a current path, and left and right wing portions 6c and 6d serving for heat dissipation and positioning. Moreover, the main lead 6 is made thicker in the element mount portion 6a on which the submount 3 is mounted and in parts of the wing portions 6c and 6d and thinner in the lead portion 6b and the remaining parts of the wing portions 6c and 6d. In the example being described, with respect to a boundary line running at the base portion of the lead portion 6b, i.e., where the lead portion 6b connects to the element mount portion 6a, the portion of the main lead 6 located in front of the boundary line is the thicker portion 6e and the portion of the main lead 6 located behind the boundary line is the thinner portion 6f. For example, the front portion is made about 0.5 to 1.5 mm thick as the thicker portion 6e, and the rear portion is made about 0.3 to 0.5 mm thick as the thinner portion 6f. The thicker portion 6e is thicker than the thinner portion 6f; specifically, the former is about 1.2 to 3 times as thick as the latter.

The subsidiary leads 7 and 8 are made as thin as the lead portion 6b. Thus, it is easy to form the lead frame 2 even into an intricate shape when it is punched out by pressing. This makes it possible to narrow the intervals between lead portions and thereby miniaturize the semiconductor laser device.

As described above, the lead frame 2 has different thicknesses along the direction X in which laser light is emitted. Thus, a step 9 is formed so as to run perpendicularly to the laser emission direction. This step 9 is formed on the reverse face of the lead frame opposite to the face thereof on which the semiconductor laser element 4 is mounted. The step 9 may be formed on the same face on which the semiconductor laser element 4 is mounted.

The thicker portion 6e of the main lead 6 is formed over the whole width of the main lead 6 so as to lie in the element mount portion 6a and in the wing portions 6c and 6d. This increases the heat dissipation efficiency and mechanical strength of the main lead 6. Thus, it is possible to prevent the wing portions 6c and 6d from being deformed when they are inserted into grooves during mounting. Moreover, the thicker portion of the main lead 6 is formed, in the direction of the width of the resin 5, over a width equal to or greater than the width of the resin 5. Thus, the resin 5 is reinforced. This helps increase the mechanical strength of the semiconductor laser device 1. Moreover, between the element mount portion 6a and each of the left and right wing portions 6c and 6d, holes 6i are formed as indicated by broken-line circles in FIG. 2 so as to link the upper and lower portions of the resin 5 (i.e., the portions thereof on the obverse and reverse faces of the lead). These resin link holes 6i can be formed in the thicker portion 6e, and can thus be formed large enough.

The resin 5 is formed by, for example, insert molding so as to sandwich the lead frame 2 from the obverse and reverse faces thereof. The resin 5, on the obverse face of the lead frame 2, forms a U-shaped frame 5b having a light emission window 5a. As shown in FIG. 2, the portion of the resin 5 located above the lead frame 2 is so shaped as to be narrower at the front end, where the width is A, than at the rear end, where the width is B, to allow easy insertion into the desired position. The portion of the resin 5 located below the lead frame 2 may be so shaped that the width A at the front end and the width B at the rear end are equal; here, however, as shown in FIG. 3, as with the portion located above the lead frame 2, the width A is made smaller than the width B to allow easy insertion into the desired position. In front end portions of both side edges of the resin frame 5b, tapered surfaces 5c are formed. These tapered surfaces 5c allow smooth insertion of the semiconductor laser device 1 into the desired position. The circular resin link holes 6i mentioned above are formed in the portion of the resin having the greater width, and are thus located behind the tapered surfaces 5c.

The reverse face of the resin 5 is formed into a flat surface 5d so as to cover the element mount portion 6a, and has an external shape (hexagonal) similar to that of the resin frame 5b on the obverse face thereof. That is, the width A at the front end is smaller than the width B at the rear end. In front end portions of both side edges of the reverse face, tapered surfaces 5e are formed. These tapered surfaces 5e allow smooth insertion of the semiconductor laser device 1 into the desired position. Moreover, the obverse face (flat surface 5d) of the resin 5, which constitutes the reverse face of the semiconductor laser device 1, forms a support surface having a larger area than the thicker element mount portion 6a. This ensures more stable placement of the semiconductor laser device 1 on the desired surface.

Since the main lead 6 has its front portion made thicker, it is wide at its front end face. Thus, by using the front end faces of the element mount portion 6a and the wing portions 6c and 6d, which all protrude from the resin 5, as a reference for positioning, it is possible to secure a wide reference surface. In particular, the front end face of the main lead 6 is thicker than the lead portion 6b or the subsidiary leads 7 and 8, and therefore using it makes it possible to secure a wider reference surface for positioning than using an ordinary lead (similar to the lead portion 6b or the subsidiary leads 7 and 8).

Moreover, since the resin 5 is made narrower at the front end, the widths of the front end faces of the wing portions 6c and 6d can be made greater than when no tapered surfaces 5c are formed. This makes it possible to secure a wide reference surface by using the front end faces of the wing portions 6c and 6d as a reference for positioning. In particular, as described above, the front end faces of the wing portions are thicker than the lead portion 6b or the subsidiary leads 7 and 8, and therefore using them makes it possible to secure a wide reference surface. Thus, increasing the widths there is extremely useful for positioning.

The element mount portion 6a of the main lead 6 and the subsidiary leads 7 and 8 are surrounded by the resin frame 5b so that no part of the resin 5 exists on them, and therefore their surfaces are exposed. The semiconductor laser element 4 is mounted on and fixed to the element mount portion 6a so exposed, with the submount 3 placed in between. Thereafter, necessary wiring is strung among the semiconductor laser element 4, the submount 3, and the subsidiary leads 7 and 8.

Part of the reverse faces of the main lead 6 and the subsidiary leads 7 and 8 is covered by the reverse face 5d of the resin 5, i.e., a thin layer of the resin 5. This resin reverse face 5d, which constitutes the reverse face of the semiconductor laser device 1, forms a support surface having a larger area than the thicker element mount portion 6a. This ensures more stable placement of the semiconductor laser device 1 on the desired surface. The resin reverse face 5d is formed preferably into a flat surface so as to be suitable as a support surface as described above. As long as it serves as a support surface, however, the resin reverse face 5d may have a recess formed in part thereof to allow the reverse face of the element mount portion 6a.

The submount 3 is a light-receiving element of which the base material is Si, and allows monitoring of the rear emission light of the semiconductor laser element 4. The submount 3 may be formed out of any other material than Si, for example a ceramic, metal, or other material having high thermal conductivity such as AlN, SiC, or Cu. If a light-emitting element cannot be incorporated into the submount 3, it is separately mounted. The submount 3 is fixed to the element mount portion 6a by using a soldering material such as Au—Sn, Pb—Sn, Au—Sn, or Sn—Bi, Ag paste, or the like.

The semiconductor laser element 4 is fixed to the submount 3 in a predetermined position thereon by using a soldering material such as Au—Sn or Pb—Sn, Ag paste, or the like.

In the embodiment described above, the subsidiary leads 7 and 8 are uniformly as thin as the lead portion 6b; however, they may be so formed as to have thicker and thinner portions like the main lead 6. In that case, preferably, the thicker portions are formed within the region located inside the resin frame 5b, and the remaining portions are made thinner. Then, the thicker portions of the subsidiary leads 7 and 8, like that of the main lead 6, serve to prevent the lead frame 2 from dropping out of the resin 5.

Figure 5:
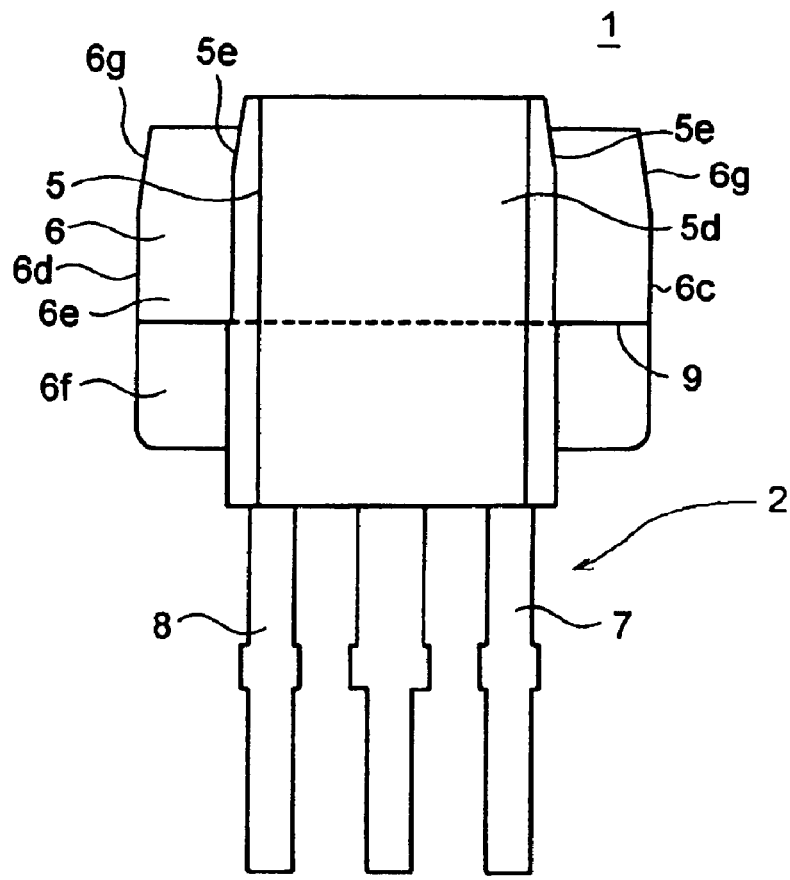
FIG. 5 is a rear view of the semiconductor laser device of the first embodiment of the invention, with tapered surfaces additionally formed in front end portions of both side faces of the main lead.
Figure 6:
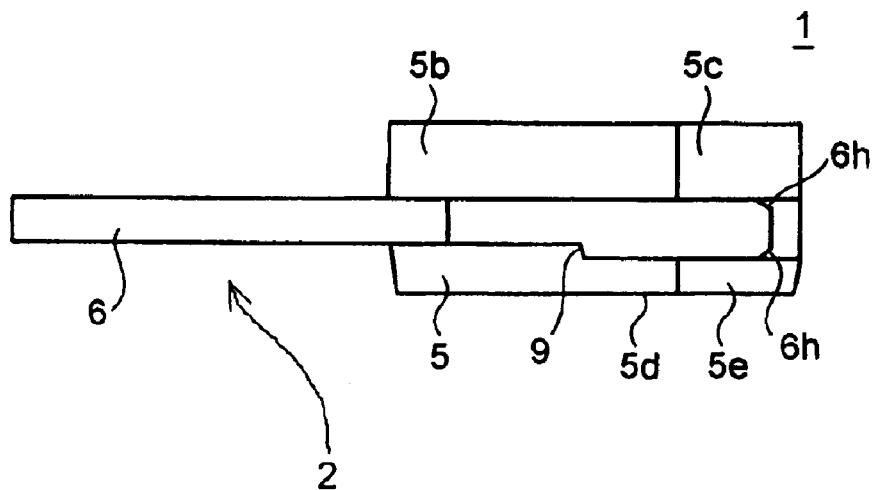
FIG. 6 is a side view of the semiconductor laser device of the first embodiment of the invention, with tapered surfaces additionally formed in top and bottom portions of the front end face of the main lead.

The embodiment described above deals with an example in which tapered surfaces 5c and 5e are formed in front end portions of both side edges of the resin 5 on the obverse or reverse face thereof. As shown in FIG. 5, it is also possible to form similar tapered surfaces 6g in the wing portions 6c and 6d. These tapered surfaces 6g are formed in front end portions of both side edges of the main lead 6. As shown in FIG. 6, it is also possible to form tapered surfaces 6h in at least one of top and bottom portion of the front end faces of the wing portions 6c and 6d. These tapered surfaces, just like those formed in the embodiment described above, allow smoother insertion of the semiconductor laser device 1.

Figure 7:
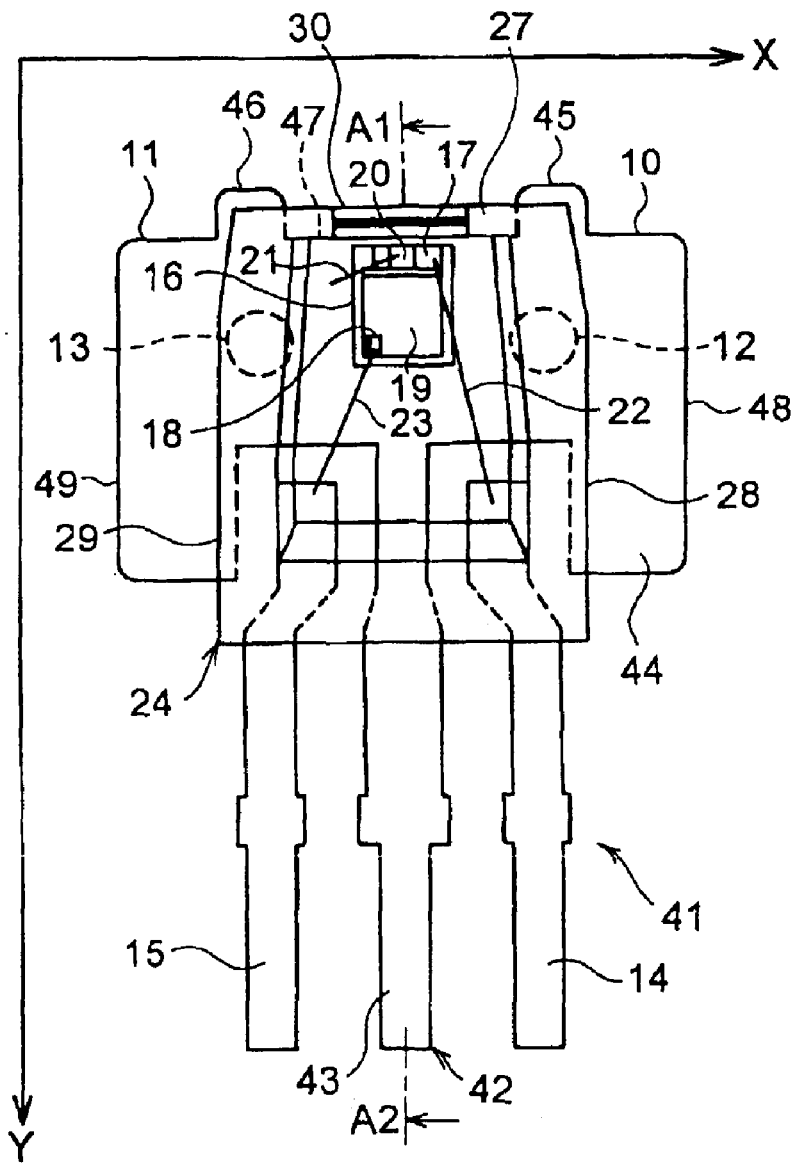
FIG. 7 is a front view of the semiconductor laser device of a second embodiment of the invention.
Figure 8:
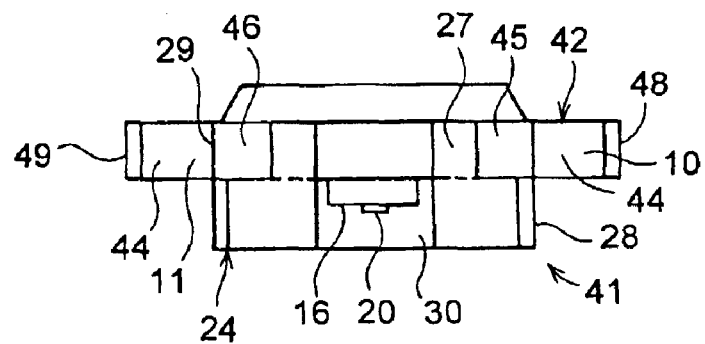
FIG. 8 is a plan view of the semiconductor laser device of the second embodiment of the invention.
Figure 9:
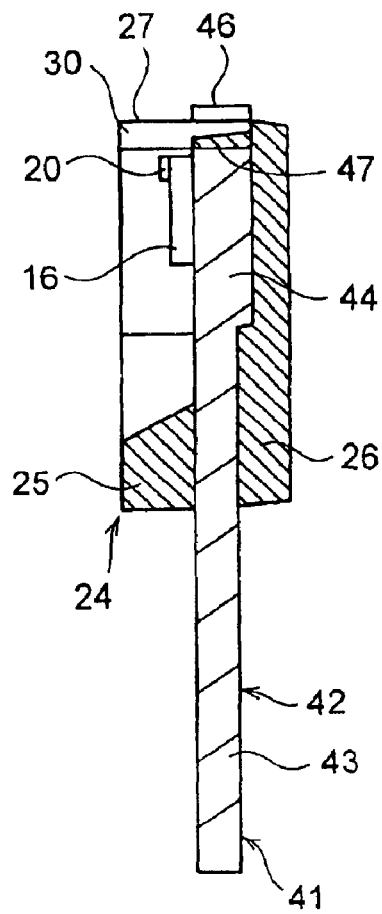
FIG. 9 is a sectional view of the semiconductor laser device of the second embodiment of the invention shown in FIG. 7, taken along line A1-A2.

Next, the semiconductor laser device 41 of a second embodiment of the invention will be described with reference to FIGS. 7 to 9. FIG. 7 is a front view of the semiconductor laser device 41 of the second embodiment of the invention. FIG. 8 is a plan view of the semiconductor laser device 41 of the second embodiment of the invention. FIG. 9 is a sectional view of the semiconductor laser device of the second embodiment of the invention shown in FIG. 7, taken along line A1-A2. In these figures, a main lead 42 is made of a plated metal material such as copper, and has a thickness of, for example, 0.2 to 1.0 mm.

The main lead 42, when seen in a front view (see FIG. 7), is substantially T-shaped. The main lead 42 consists of a terminal portion 43, a base portion 44, projections 45 and 46, a cut 47, and other portions.

The terminal portion 43, when seen in a front view, is substantially rectangular. The base portion 44 is so formed as to link to the terminal portion 43, and has a substantially rectangular external shape (with cuts formed in parts thereof).

In the external shape of the base portion 44, reference portions 48 and 49 are formed in the vertical direction (Y direction), and reference portions 10 and 11 are formed in the horizontal direction (X direction). When the semiconductor laser device 41 is fitted to a bracket component (not shown), those reference portions 48, 49, 10, and 11 are kept in contact with inner surfaces of the bracket component, and this allows the semiconductor laser device 41 to be positioned accurately. Thus, the reference portions 48, 49, 10, and 11 serve as reference for the fitting of the main lead 42.

The projections 45 and 46 are formed next to the reference portions 10 and 11, respectively, and the cut 47 is formed between the projections 45 and 46. The projections 45 and 46 protrude from the reference portions 10 and 11 upward in the vertical direction (Y direction). That is, the projections 45 and 46 are formed outside the reference portions 10 and 11 (on that side thereof farther from the laser element described later).

As described above, the cut 47 is formed in front of the element mount portion of the main lead 42 on which the laser element is mounted, and the projections 45 and 46 are formed on both sides of the cut 47 next thereto. Moreover, through holes 12 and 13 are formed in appropriate positions in the base portion 44 of the main lead 42.

A light-receiving element 16 is, for example, a silicon-based crystal having a P-I-N structure and having obverse face electrodes 17 and 18 and a reverse face electrode (not shown) formed thereon. The obverse face electrode 18 is so formed as to achieve an ohmic contact with a light-receiving portion 19 formed as a P-type diffusion region. The reverse side electrode of the light-receiving element 16 is fixed to the base portion 44 of the main lead 42 with conductive adhesive such as Ag paste laid in between.

Used as a laser element 20 is, for example, a laser element using a material such as a GaAlAs-based semiconductor composed of an active layer and clad layers sandwiching it, an AlGaInP- or AlGaInPAs-based semiconductor as used in red semiconductor laser elements for high-density optical disks, a GaN-based semiconductor as used in electronic devices such as transistors, or a II–VI semiconductor. The laser element 20 has a reverse face electrode (not shown) thereof fixed to the obverse face electrode 17 of the light-receiving element 16 with Ag paste or the like laid in between so that the main emission surface of the laser element 20 faces frontward (in the direction indicated as A1). In this way, the laser element 20 is mounted on the main lead 42.

The laser element 20 is so formed that the reflectance of the reflective film on its rear face is higher than that on its front face. This allows the laser element 20 to output subsidiary emission rearward for monitoring.

Subsidiary leads 14 and 15 are each formed out of, for example, a plated metal material such as copper. The subsidiary leads 14 and 15 are arranged so as to be adjacent to the terminal portion 43 of the main lead 42.

A metal fine lead 21 is formed out of gold or the like, and is strung so as to connect the obverse face electrode of the laser element 20 to the base portion 44 of the main lead 42. A metal fine lead 21 is formed out of gold or the like, and is strung so as to connect the obverse face electrode 17 of the light-receiving element 16 to the subsidiary lead 14. A metal fine lead 23 is formed out of gold or the like, and is strung so as to connect the obverse face electrode 18 of the light-receiving element 16 to the subsidiary lead 15.

A resin frame 24 is formed out of, for example, polycarbonate resin, epoxy resin, or the like. The resin frame 24 is formed by transfer molding so that it is, for example, substantially C-shaped when seen in a plan view so as to expose the light emission surface of the laser element 20 and that it sandwiches the main lead 42 and the subsidiary leads 14 and 15 from both obverse and reverse faces thereof.

Thus, the resin frame 24 serves to protect the laser element 20. Moreover, the resin frame 24 is so formed that its portions 25 and 26 on the obverse and reverse faces, respectively, of the main lead 42 are linked together through the through holes 12 and 13 formed in the base portion 44 of the main lead 42.

The resin frame 24 has an outer edge 27 thereof located inside the front end of the main lead 42 (on that side thereof nearer to the laser element 20), i.e., inside the projections 45 and 46 of the main lead 42. Moreover, the resin frame 24 has outer edges 28 and 29 thereof located inside both side edges of the main lead 42 (in that side thereof nearer to the laser element 20).

Specifically, the outer edges 27, 28, and 29 of the resin frame 24 are located inside the reference portions 48, 49, 10, and 11 (on that side thereof nearer to the laser element 20) used as references for the fitting of the main lead 42. This structure prevents a resin leak occurring in the reference portions 48, 49, 10, and 11 when the resin frame 24 is a molded result of a punching sag (a slight curve in the cross section occurring opposite to the burr during punching-out) formed in the main lead 42 when it is punched out.

A window 30 is formed in a front portion of the resin frame to expose the main emission surface of the laser element 20 (i.e., so as not to intercept the main emission light). The components described above constitute the semiconductor laser device 41.

As described above, the laser element 20 is mounted on the light-receiving element 16. It is also possible, however, to mount the laser element 20, directly or with a submount interposed, on the main lead 42 in front of the light-receiving element 16.

Figure 10:
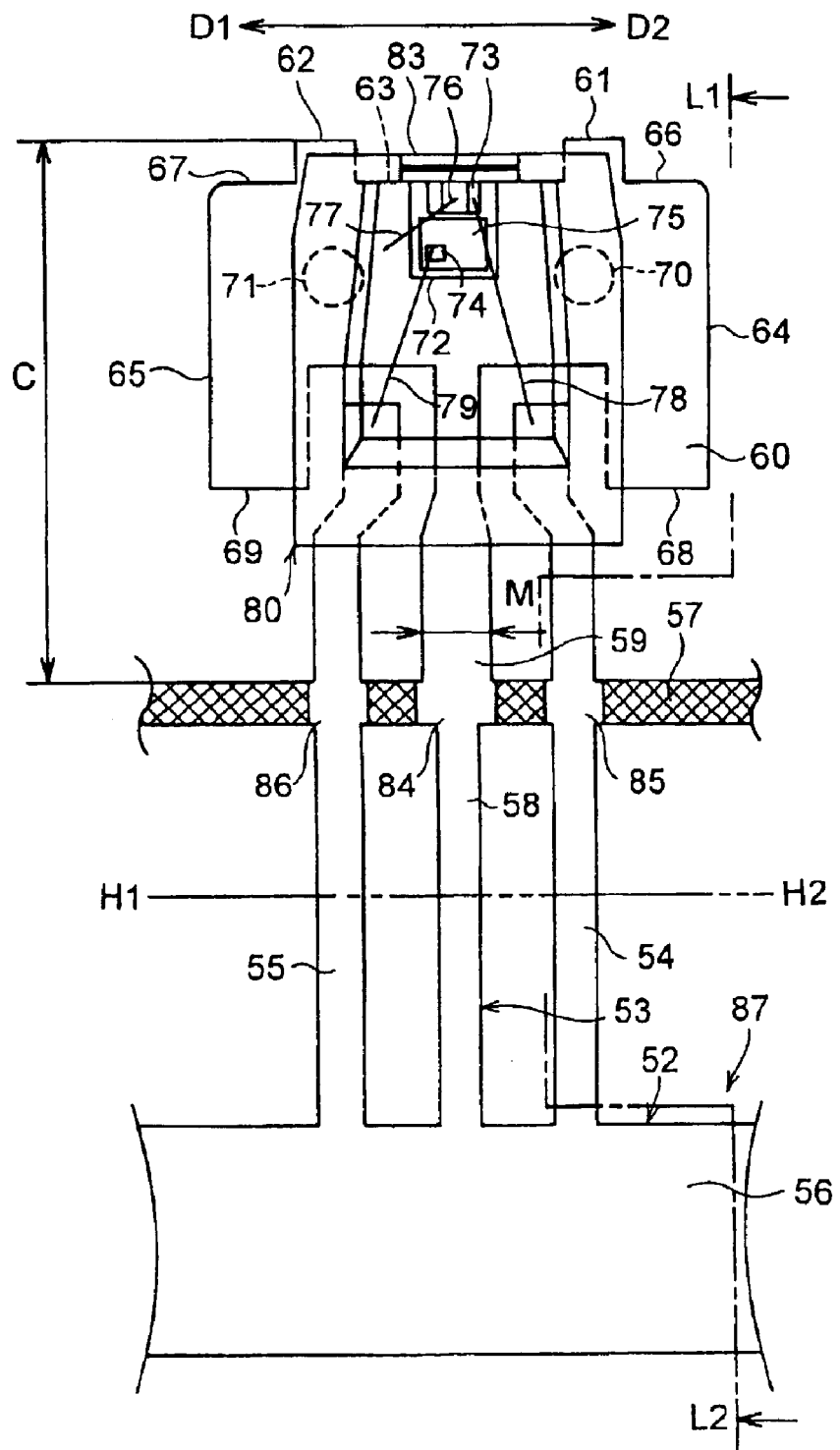
FIG. 10 is a front view of the semiconductor laser device of a third embodiment of the invention, showing how it is set before the tie bar is cut.
Figure 11:
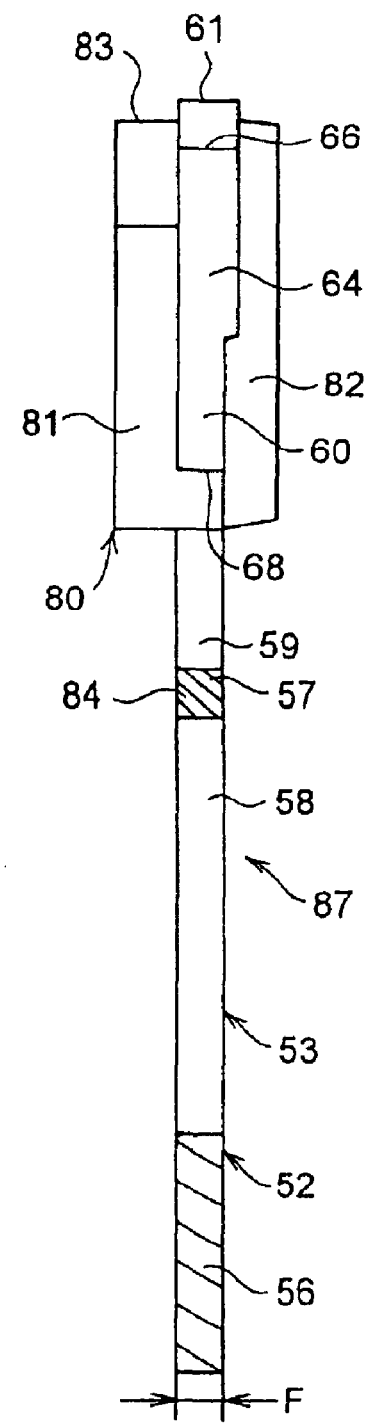
FIG. 11 is a sectional view of the semiconductor laser device of the third embodiment of the invention shown in FIG. 10, taken along line L1-L2.

Next, the fabrication of the semiconductor laser device 51 of a third embodiment of the invention will be described with reference to FIGS. 10 and 11. FIG. 10 shows a state of the semiconductor laser device 51 before the tie bar is cut, and FIG. 11 is a sectional view along line L1-L2 shown in FIG. 10.

In these figures, a lead frame 52 is formed out of, for example, a plated metal material such as copper, and has a thickness of, for example, 0.2 to 1.0 mm. The lead frame 52 consists of a first lead 53, a second lead 54, and a third lead 55 each connected at one end to an outer frame 56.

A tie bar 57 is connected to a mid point of each of the first, second, and third leads 53, 54, and 55. A plurality of sets of first, second, and third leads (not shown) shaped identically with the first, second, and third leads 53, 54, and 55 are, at one end, connected to the outer frame 56, and, at a mid point, connected to the tie bar 57. The plurality of sets of first, second, and third leads 53, 54, and 55, the outer frame 56, the tie bar 57, and other portions together constitute the lead frame 52 as a whole.

The first lead 53 consists of a terminal portion 58, a link portion 59, a base portion 60, projections 61 and 62, a cut 63, and other portions. The terminal portion 58, when seen in a front view, is rectangular, and lies between the outer frame 56 and the tie bar 57.

The link portion 59 links the tie bar 57 and the base portion 60 together. The base portion 60 has a substantially rectangular external shape (with cuts formed in parts thereof).

In the external shape of the base portion 60, reference portions 64 and 65 are formed in the vertical direction, and reference portions 66 and 67 are formed in the horizontal direction. That is, the reference portions 64 and 65 are both side edges of the first lead 53, and the reference portions 66 and 67 are the top edge of the first lead 53. A portion 68 opposite to the reference portion 66 is not linked to the be bar 57, nor is a portion 69 opposite to the reference portion 67 linked to the tie bar 57.

When the semiconductor laser device 51 is fitted to a bracket component (not shown), the above-mentioned reference portions 64, 65, 66, and 67 are kept in contact with inner surfaces of the bracket component, and this allows the semiconductor laser device 51 to be positioned accurately.

The projections 61 and 62 are formed next to the reference portions 66 and 67, respectively, and the cut 63 is formed between the projections 61 and 62. The projections 61 and 62 protrude outward from the reference portions 66 and 67 and the cut 63.

As described above, the cut 63 is formed in front of the element mount portion of the first lead 53 on which the laser element (described later) is mounted. Moreover, through holes 70 and 71 are formed in appropriate positions in the base portion 60. The projections 61 and 62 are formed on both sides of the cut 63 next thereto.

A light-receiving element 72 is, for example, a silicon-based crystal having a P-I-N structure and having obverse face electrodes 73 and 74 and a reverse face electrode (not shown) formed thereon. The obverse face electrode 74 is so formed as to achieve an ohmic contact with a light-receiving portion 75 formed as a P-type diffusion region. The reverse side electrode of the light-receiving element 66 is fixed to the base portion 60 of the first lead 53 with as Ag paste or the like laid in between.

Used as a laser element 76 is, for example, a laser element using a material such as a GaAlAs-based semiconductor composed of an active layer and clad layers sandwiching it, an AlGaInP or AlGaInPA based semiconductor as used in red semiconductor laser elements for high-density optical disks, a GaN-based semiconductor as used in electronic devices such as transistors, or a II–VI semiconductor.

The laser element 76 has a reverse face electrode (not shown) thereof fixed to the obverse face electrode 73 of the light-receiving element 72 with Ag paste or the like laid in between so that the main emission surface of the laser element 76 faces frontward. In this way, the laser element 76 is mounted on the first lead 53.

The laser element 76 is so formed that the reflectance of the reflective film on its rear face is higher than that on its front face. This allows the laser element 20 to output subsidiary emission rearward for monitoring.

A metal fine lead 77 is formed out of gold or the like, and is strung so as to connect the obverse face electrode of the laser element 76 to the base portion 60 of the first lead 53.

A metal fine lead 78 is formed out of gold or the like, and is strung so as to connect the obverse face electrode 73 of the light-receiving element 72 to the second lead 54. A metal fine lead 79 is formed out of gold or the like, and is strung so as to connect the obverse face electrode 74 of the light-receiving element 72 to the third lead 55.

A resin frame 80 is formed out of, for example, polycarbonate resin, epoxy resin, or the like. The resin frame 80 is formed by transfer molding so that it is, for example, substantially C-shaped when seen in a plan view so as to expose the light emission surface of the laser element 76 and that it sandwiches the first, second, and third leads 53, 54, and 55 from both obverse and reverse faces thereof.

Thus, the resin frame 80 serves to protect the laser element 76. Moreover, the resin frame 80 is so formed that its portions 81 and 82 on the obverse and reverse faces, respectively, of the first lead 53 are linked together through the through holes 70 and 71 formed in the base portion 60 of the first lead 53.

A window 83 is formed in a front portion of the resin frame 80 to expose the main emission surface of the laser element 76 (i.e., so as not to intercept the main emission light). The components described above constitute a semiconductor laser device set 87, with the semiconductor laser device 51 in a state before the tie bar is cut.

Next, for an energizing test, the outer frame 56 is fed over a predetermined distance in the horizontal direction (for example, in the direction indicated as D2) on a machine (not shown). Here, even though the feeding causes vibration, the tip portion of the first lead 53, for example, develops almost no inclination (i.e. only so slight an inclination as to be practically negligible) in the direction indicated as D1 or D2. Thus, when a test probe is driven by a machine to automatically touch the obverse face electrodes 73 and 74 and the like as in an energizing test, the test probe touches just the right positions it is supposed to.

To prevent, in this way, the tip portion of the first lead 53 from inclining in the direction D1 or D2 as a result of the vibration of the feeding or the like, the structure here is worked out as follows. The width M (for example, 0.9 mm) of the link portion 59 of the first lead 53 located above the tie bar traces 84 (described later) is made equal to or greater than 1.3 times the thickness F (for example, 0.6 mm) of the first lead 53. Moreover, the distance C from the upper edge of the time bar traces 84 to the tip end of the first lead 53 (the tip end of the projection 61) is 3 mm to 10 mm.

With this structure, when the outer frame 56 is being fed or has just been fed, or when an external force is applied to the tip end of the first lead 53 by a finger or the like, the tip portion of the first lead 53 develops almost no inclination in the direction D1 or D2. This is because, in this structure, the link portion 59 of the first lead 53 is linked firmly to the tie bar 57 so that the first lead 53 develops almost no inclination.

Next, a lower die (not shown) is placed on the reverse face side of the first, second, and third leads 53, 54, and 55, and an upper die (not shown) is pressed onto the obverse face side of the first, second, and third leads 53, 54, and 55 so that the first, second, and third leads 53, 54, and 55 are cut apart from the outer frame 56.

Simultaneously, the tie bar 57 is cut, with tie bar traces 84, 85, and 86 left on the first, second, and third leads 53, 54, and 55, respectively. Line H1-H2 (see FIG. 10) indicates the line along which the external shapes of the first, second, and third leads 53, 54, and 55 are cut. Through the processes described above, the semiconductor laser device 51 as an end product is fabricated.

Figure 12:
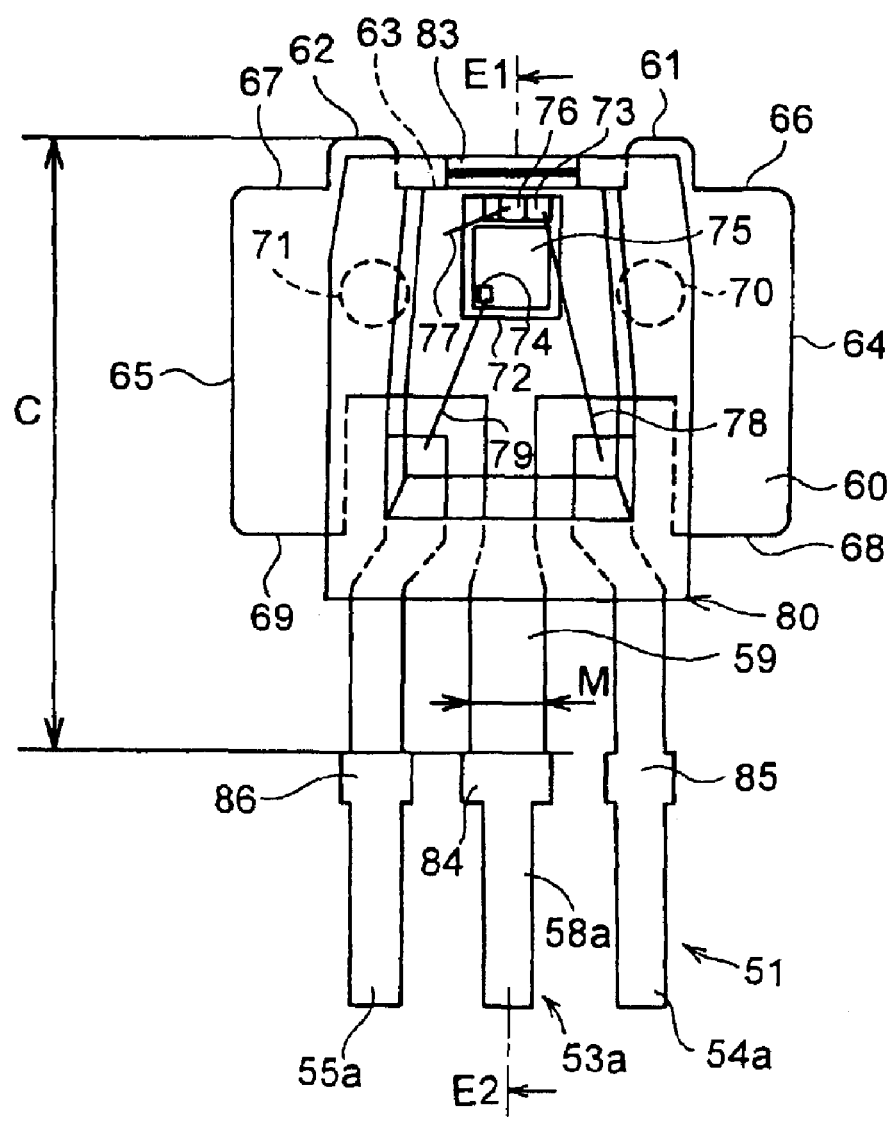
FIG. 12 is a front view of the semiconductor laser device of the third embodiment of the invention shown in FIG. 10.
Figure 13:
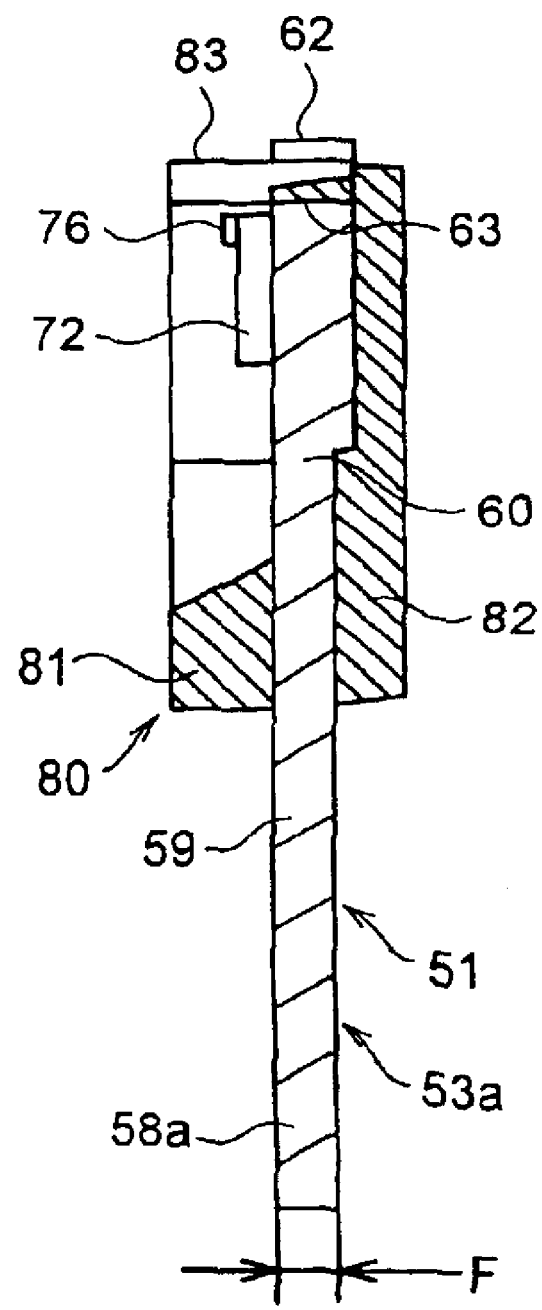
FIG. 13 is a sectional view of the semiconductor laser device of the third embodiment of the invention shown in FIG. 12, taken along line E1-E2.
Figure 14:
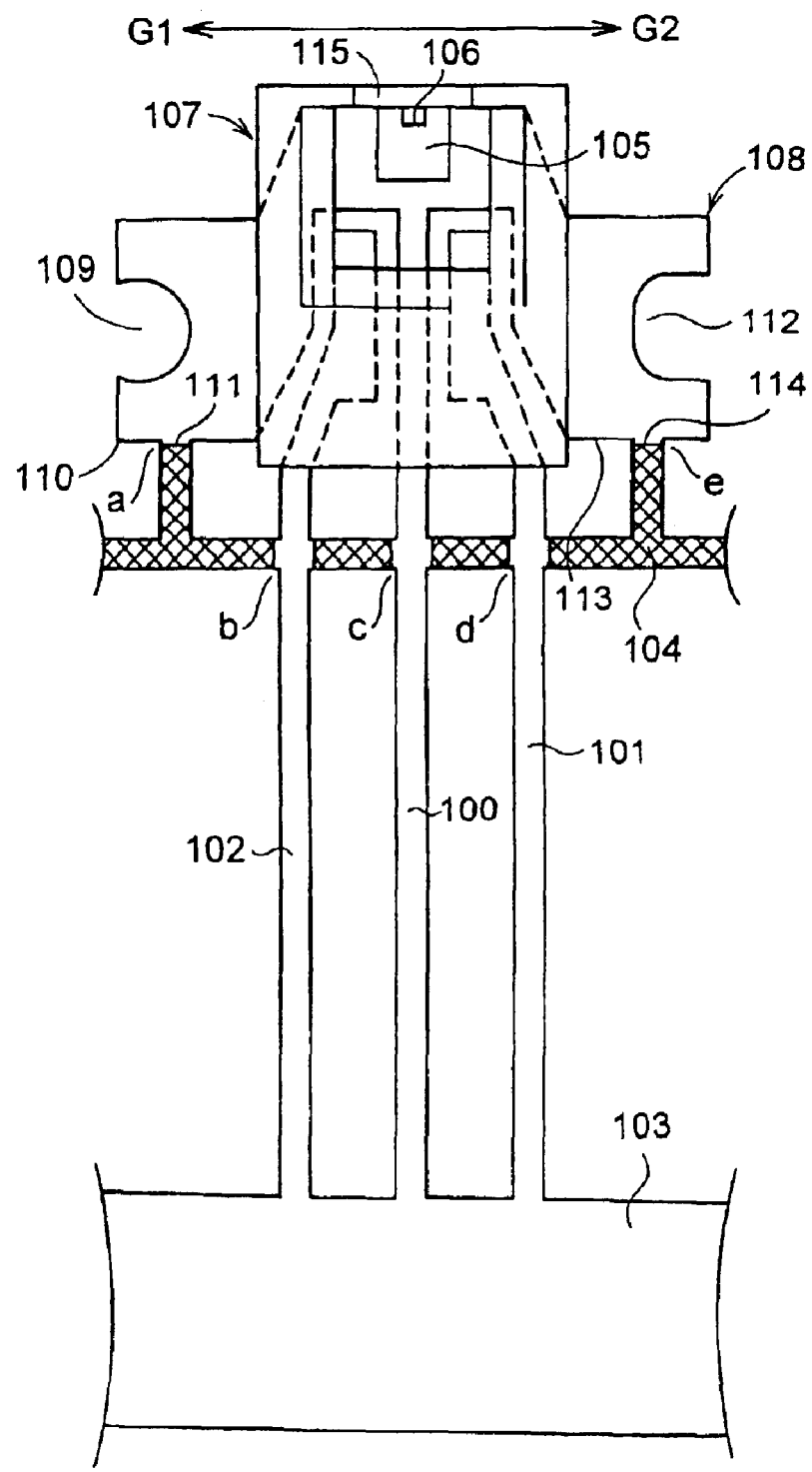
FIG. 14 is a front view of a conventional semiconductor laser device, showing how it is set.

Next, this semiconductor laser device 51 will be described with reference to FIGS. 12 and 13. FIG. 12 is a front view of the semiconductor laser device 51, and FIG. 13 is a sectional view along line E1-E2 shown in FIG. 12.

In these figures, a lead 53a results from the first lead 53 shown in FIG. 10, as a result of the tie bar being cut off and the external shape of the first lead 53 being cut along line H1-H2. The lead 53a is formed out of, for example, a plated metal material such as copper, and has a thickness of, for example, 0.2 to 1.0 mm (in the example being described, F=0.6 mm).

The lead 53a, when seen in a front view (see FIG. 12), is substantially T-shaped. The lead 53a consists of a terminal portion 58a, a tie bar trace 84, a link portion 59, a base portion 60, projections 61 and 62, a cut 63, and other portions. The terminal portion 58a, when seen in a front view, is substantially rectangular, and results from the terminal portion 58 shown in FIG. 10 being cut along line H1-H2. The link portion 59 links the tie bar trace and the base portion 60 together.

In the external shape of the base portion 60, reference portions 64 and 65 are formed in the vertical direction, and reference portions 66 and 67 are formed in the horizontal direction. That is, the reference portions 64 and 65 are both side edges of the lead 53a, and the reference portions 66 and 67 are the top edge of the lead 53a.

Since a portion 68 opposite to the reference portion 66 is not linked to the tie bar 57, there is no tie bar trace here; likewise, since a portion 69 opposite to the reference portion 67 is not linked to the tie bar 57, there is no tie bar trace here. Thus, the tie bar trace 84 on the lead 53a is left at one location elsewhere than in the reference portions 64, 65, 66, and 67 of the lead 53a, elsewhere than in the portion 68 opposite to the reference portion 66, and elsewhere than in the portion 69 opposite to the reference portion 67.

When the semiconductor laser device 51 is fitted to a bracket component (not shown), the above-mentioned reference portions 64, 65, 66, and 67 are kept in contact with inner surfaces of the bracket component, and this allows the semiconductor laser device 51 to be positioned accurately. This is because, when the semiconductor laser device 51 is inserted into a bracket component with the opposite portions 68 and 69 pressed with jigs or the like, the absence of tie bar traces in the opposite portions 68 and 69 allows insertion of the semiconductor laser device 51 into the desired position.

The projections 61 and 62 are formed next to the reference portions 66 and 67, respectively, and the cut 63 is formed between the projections 61 and 62. The projections 61 and 62 protrude outward from the reference portions 66 and 67 and the cut 63.

As described above, the cut 63 is formed in front of the element mount portion of the lead 53a on which a laser element 76 is mounted. Moreover, through holes 70 and 71 are formed in appropriate positions in the base portion 60. The projections 61 and 62 are formed on both sides of the cut 63 next thereto. In this structure, when the semiconductor laser device 51 is handled, the projections 61 and 62 serve as guards, preventing the laser element 76 from coming into contact with a finger or the like.

A light-receiving element 72 is, for example, a silicon-based crystal having a P-I-N structure and having obverse face electrodes 73 and 74 and a reverse face electrode (not shown) formed thereon. The obverse face electrode 74 is so formed as to achieve an ohmic contact with the light-receiving portion 75 formed as a P-type diffusion region. The reverse side electrode of the light-receiving element 72 is fixed to the base portion 60 of the lead 53a with as Ag paste or the like laid in between.

Used as the laser element 76 is, for example, a laser element using a material such as a GaAlAs-based semiconductor composed of an active layer and clad layers sandwiching it, an AlGaInP- or AlGaInPAs-based semiconductor as used in red semiconductor laser elements for high-density optical disks, a GaN-based semiconductor as used in electronic devices such as transistors, or a II–VI semiconductor. The laser element 76 has a reverse face electrode (not shown) thereof fixed to the obverse face electrode 73 of the light-receiving element 72 with Ag paste or the like laid in between so that the main emission surface of the laser element 76 faces frontward. In this way, the laser element 76 is mounted on the lead 53a.

A metal fine lead 77 is formed out of gold or the like, and is strung so as to connect the obverse face electrode of the laser element 76 to the base portion 60 of the lead 53a. A metal fine lead 78 is formed out of gold or the like, and is strung so as to connect the obverse face electrode 73 of the light-receiving element 72 to another lead 54a (the second lead 54 shown in FIG. 10 cut along line H1-H2). A metal fine lead 79 is formed out of gold or the like, and is strung so as to connect the obverse face electrode 74 of the light-receiving element 72 to another lead 55a (the third lead 55 shown in FIG. 10 cut along line H1-H2).

A resin frame 80 is formed out of, for example, polycarbonate resin, epoxy resin, or the like. The resin frame 80 is formed by transfer molding so that it is, for example, substantially C-shaped when seen in a plan view (see FIG. 12) so as to expose the light emission surface of the laser element 76 and that it sandwiches the lead 53a and the other leads 54a and 55a from both obverse and reverse faces thereof. Thus, the resin frame 80 serves to protect the laser element 76.

A window 83 is formed in a front portion of the resin frame 80 to expose the main emission surface of the laser element 76 (i.e., so as not to intercept the main emission light). The components described above constitute the semiconductor laser device set 51.

In this semiconductor laser device 51, the width M (for example, 0.9 mm) of the link portion 59 of the lead 53a located above the tie bar traces 84 is made equal to or greater than 1.3 times the thickness F (for example, 0.6 mm) of the lead 53a. Moreover, the distance C from the upper edge of the time bar traces 84 to the tip end of the lead 53a (the tip end of the projection 61) is 3 mm to 10 mm.

With this structure, when the outer frame 56 (see FIG. 10) is being fed or has just been fed, or when an external force is applied to the tip end of the first lead 53 by a finger or the like, the tip portion of the first lead 53 develops almost no inclination in the direction D1 or D2. This is because, in this structure, the link portion 59 of the first lead 53 is linked firmly to the tie bar 57 so that the first lead 53 develops almost no inclination.

The embodiments described above deal with semiconductor laser devices employing laser elements. The structures of the embodiments, however, are applicable also to semiconductor light-emitting devices employing light-emitting elements other than laser elements, such as LED elements.

Obviously, many modifications and variations of the present invention are possible in light of the above teachings. It is therefore to be understood that within the scope of the appended claims, the invention may be practiced other than as specifically described.

INDUSTRIAL APPLICABILITY

As described above, according to the present invention, by making a lead partially thick, it is possible to improve heat dissipation and mechanical strength. It is also possible to stabilize reference surfaces for positioning and thereby improve the fitting accuracy. Moreover, in a semiconductor laser device of a lead frame package type, even a lead having a step is used, it is possible to secure a wide support surface and achieve stable fitting. It is also possible to realize a semiconductor laser device that can be easily inserted into an optical pickup or the like. Moreover, where part of a lead is used as a reference for fitting, it is possible to secure a wide area as a reference surface. Furthermore, it is possible to realize a lead frame package having a simple structure and easy to mass-produce.

Moreover, according to the present invention, by locating the outer profile of a resin frame inside the tip and both side edges of a lead, it is possible to prevent a resin leak in the resin frame resulting from a sag formed in the tip and side edges of the lead when it is punched out. Moreover, by locating the outer profile of a resin frame inside the reference portions of a lead, it is possible to prevent a resin leak in the resin frame resulting from a sag formed in the reference portions of the lead when it is punched out. This prevents adherence of unwanted resin to the reference portions and thus keeps the reference portions accurate for fitting. Moreover, a cut is formed in a lead in front of a laser element. This prevents the laser light from being reflected on the surface of the lead. Moreover, projections are formed next to the cut. Thus, when a semiconductor laser device is handled, the laser element is less likely to come into contact with a finger or tweezers. Moreover, by locating the outer profile of the resin frame inside the tip edges of the projections, it is possible to prevent a resin leak in the resin frame resulting from a sag formed in those edges of the lead when it is punched out. Moreover, the upper and lower portions of the resin are linked together with the lead sandwiched in between. This prevents the lead from easily dropping out of the resin frame.

Moreover, according to the present invention, no tie bar traces are left in portions opposite to reference portions. Thus, when a semiconductor laser device is inserted into a bracket component, even if those opposite portions are pressed with jigs or the like, the semiconductor laser device can be fitted accurately in the desired position in the bracket component. Moreover, by using the top and both side edges of a lead as reference portions, it is possible to perform the fitting thereof with respect to two mutually perpendicular directions. This allows a semiconductor laser device to be fitted accurately relative to a bracket component. Moreover, when a semiconductor laser device is handled, projections serve as guards, preventing a laser element from coming into contact with a finger or tweezers. Moreover, a cut is formed in the lead in front of the laser element. This prevents the laser light from being reflected on the surface of the lead. Moreover, in the fabrication process, when a lead frame is being fed or has just been fed, or when an external force is applied to a tip end of a lead by a finger or the like, the tip portion of the lead develops almost no inclination. Thus, when, in an energizing test, a test probe is driven by a machine to automatically touch the semiconductor laser device, the test probe touches just the right positions it is supposed to. Furthermore, by making the distance from the tie bar traces to the tip end of the lead equal to or greater than 3 mm, it is possible to place a lower die between the tie bar and the bottom edge of the resin frame. This makes accurate cutting of the tie bar possible.

What is claimed is:

1. A semiconductor laser device comprising a semiconductor laser element, a lead having an element mount portion on which the semiconductor laser element is mounted, and a resin kept in intimate contact with the lead so as to sandwich the lead from an obverse face and a reverse face thereof firmly,
    wherein the lead has a thicker portion and a thinner portion each of which having a thickness, measured between the obverse face and the reverse face of the lead, different from each other, and
    the thicker portion is so formed as to extend in a direction substantially perpendicular to a length direction of the lead and have a width at least equal to a width of the resin measured in the direction substantially perpendicular to the length direction of the lead.

2. A semiconductor laser device as claimed in claim 1, wherein the lead has wing portions protruding from both side edges of the resin, and the thicker portion is so formed as to extend over a whole width of the lead.

3. A semiconductor laser device as claimed in claim 1, wherein the thicker portion is formed in a front end portion of the lead.

4. A semiconductor laser device as claimed in claim 1,
    wherein the thicker portion is so formed as to correspond to the element mount portion on which the semiconductor laser element is mounted, and the thinner portion is formed in a lead portion of the lead.

5. A semiconductor laser device as claimed in claim 1, further comprising a second lead having no element mount portion on which to mount the semiconductor laser element, wherein the thicker portion is formed also in the second lead.

6. A semiconductor laser device as claimed in claim 1,
    wherein a hole is formed in the thicker portion to link obverse and reverse faces of the lead.

7. A semiconductor laser device as claimed in claim 1,
    wherein the resin has a window formed in a front end portion thereof to permit laser light from the semiconductor laser element to exit, and the resin is so formed that a front edge width thereof is smaller than a rear edge width thereof.

8. A semiconductor laser device as claimed in claim 7, wherein the resin has tapered surfaces formed in front end portions of both side edges thereof.

9. A semiconductor laser device as claimed in claim 7, wherein the lead has tapered surfaces formed in front end portions of both side edges thereof.

10. A semiconductor laser device as claimed in claim 9, wherein the lead further has a tapered surface formed in a top or bottom portion of a front end face thereof.

11. A semiconductor laser device as claimed in claim 1, wherein an outer profile of the resin is located inside a front edge of the lead and inside side edges of the lead.

12. A semiconductor laser device as claimed in claim 11, wherein a through hole is formed in the lead, and the resin has portions thereof on obverse and reverse faces of the lead linked through the through hole.

13. A semiconductor laser device as claimed in claim 1, wherein an outer profile of the resin is located inside a reference portion of the lead that is used as a reference for fitting.

14. A semiconductor laser device as claimed in claim 13, wherein a cut is formed in front of the element mount portion of the lead, and a projection is formed next to the cut.

15. A semiconductor laser device as claimed in claim 14, wherein the projection is located outside the reference portion, and the outer profile of the resin is located inside a tip of the projection.

16. A semiconductor laser device as claimed in claim 13, wherein a through hole is formed in the lead, and the resin has portions thereof on obverse and reverse faces of the lead linked through the through hole.

17. A semiconductor laser device as claimed in claim 1, wherein a trace of a tie bar is left at one location elsewhere than in a reference portion of the lead and elsewhere than in a portion thereof opposite to the reference portion.

18. A semiconductor laser device as claimed in claim 17, wherein the reference portion is constituted by a top edge and both side edges of the lead.

19. A semiconductor laser device as claimed in claim 17, wherein a cut is formed in front of the element mount portion, and a projection is formed next to the cut.

20. A semiconductor laser device as claimed in claim 19, wherein a link portion of the lead located above the trace of the tie bar has a width equal to or greater than 1.3 times a thickness of the lead, and a distance from the trace of the tie bar to a tip of the projection is 3 mm to 10 mm.

21. A semiconductor laser device comprising a semiconductor laser element, a lead having an element mount portion on which the semiconductor laser element is mounted and a lead portion, and a resin kept in intimate contact with the lead,
wherein the lead has different thicknesses in the element mount portion and lead portion thereof with a step left on a reverse face thereof, and the resin covers part of the lead including the step so as to form a support surface on a reverse face of the resin, the support surface having an area larger than an area of the element mount portion.

22. A semiconductor laser device as claimed in claim 21, wherein the support surface is formed as a flat surface of the resin or a frame of the resin having a recess formed in part thereof.

23. A semiconductor laser device as claimed in claim 21, wherein the lead has wing portions outside the resin, and the wing portions are thicker than the lead portion.

24. A semiconductor light-emitting device comprising a light-emitting element, a lead having an element mount portion on which the light-emitting element is mounted, and a resin kept in intimate contact with the lead so as to sandwich the lead from an obverse face and a reverse face thereof firmly,
wherein the lead has a thicker portion and a thinner portion each of which having a thickness, measured between the obverse face and the reverse face of the lead, different from each other, and
the thicker portion is so formed in a direction substantially perpendicular to a length direction of the lead and have a width at least equal to a width of the resin measured in the direction substantially perpendicular to the length direction of the lead.

25. A semiconductor light-emitting device comprising a semiconductor light-emitting element, a lead having an element mount portion on which the semiconductor light-emitting element is mounted and a lead portion, and a resin kept in intimate contact with the lead, wherein the lead has different thicknesses in the element mount portion and lead portion thereof with a step left on a reverse face thereof, and the resin covers part of the lead including the step so as to form a support surface on a reverse face of the resin,
the support surface having an area larger than an area of the element mount portion.

* * * * *